United States Patent
Dai

(10) Patent No.: US 9,524,689 B2
(45) Date of Patent: Dec. 20, 2016

(54) SCAN DRIVING CIRCUIT FOR OXIDE SEMICONDUCTOR THIN FILM TRANSISTOR

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 89 days.

(21) Appl. No.: 14/437,828

(22) PCT Filed: Jan. 12, 2015

(86) PCT No.: PCT/CN2015/070516
§ 371 (c)(1),
(2) Date: Apr. 22, 2015

(87) PCT Pub. No.: WO2016/106822
PCT Pub. Date: Jul. 7, 2016

(65) Prior Publication Data
US 2016/0343336 A1    Nov. 24, 2016

(30) Foreign Application Priority Data
Dec. 31, 2014  (CN) .......................... 2014 1 0856660

(51) Int. Cl.
G09G 3/36    (2006.01)
(52) U.S. Cl.
CPC ........ *G09G 3/3677* (2013.01); *G09G 2310/06* (2013.01); *G09G 2310/08* (2013.01)
(58) Field of Classification Search
CPC .............. G09G 3/3677; G09G 2310/08; G09G 2310/06; G09G 3/3674; G09G 2310/0286; G09G 2310/0289; G09G 3/3266
See application file for complete search history.

(56) References Cited

U.S. PATENT DOCUMENTS 8,154,323 B2 *  4/2012  Kim ................. H03K 3/356113
                                                        327/108

* cited by examiner

*Primary Examiner* — Abbas Abdulselam
(74) *Attorney, Agent, or Firm* — Andrew C. Cheng

(57) ABSTRACT

The invention provides a scan driving circuit for an oxide semiconductor thin film transistor. The scan driving circuit for an oxide semiconductor thin film transistor includes multiple cascade connected GOA units and a shared auxiliary inverter. Each of the GOA units includes a main inverter. The auxiliary inverter is electrically connected to each main inverter to form corresponding pull-down holding parts for the respective GOA units, which can achieve the sharing of the pull-down holding parts of the multiple stages GOA units, the number of TFT elements can be reduced and therefore GOA layout space as well as circuit power consumption can be reduced.

15 Claims, 5 Drawing Sheets

SCAN DRIVING CIRCUIT FOR OXIDE SEMICONDUCTOR THIN FILM TRANSISTOR

TECHNICAL FIELD

The invention relates to the field of liquid crystal display technology, and particularly to a scan driving circuit for an oxide semiconductor thin film transistor.

DESCRIPTION OF RELATED ART

A GOA (gate driver on array) circuit technology uses a thin film transistor (TFT) liquid crystal display device array process to manufacture a gate driving circuit on a thin film transistor array substrate and thereby to achieve a progressive scan driving mode.

Generally, the GOA circuit mainly is constituted by a pull-up part, a pull-up control part, a transfer part, a pull-down part, a pull-down holding part and a boost part responsible for potential boost-up. The boost part generally is constituted by a bootstrap capacitor.

The pull-up part mainly is responsible for outputting an input clock signal to a gate of a thin film transistor as a driving signal of a liquid crystal display device. The pull-up control part mainly is responsible for controlling the pull-up part to be switched on and generally is subjected to the control of a signal delivered from a preceding stage GOA circuit. The pull-down part mainly is responsible for quickly pulling down a scan signal to a low voltage level after the scan signal is outputted, i.e., pulling down the potential of the gate of the thin film transistor to the low voltage level. The pull-down holding part mainly is responsible for holding the scan signal and a signal of the pull-up part at a switched-off state (i.e., a set negative potential). The boost part mainly is responsible for lifting up the potential of the pull-up art once again so as to ensure the normal output of the pull-up part.

In a related art (as shown in FIG. 1), a scan driving circuit of an oxide semiconductor thin film transistor generally is a plurality of stages same GOA circuits connected in cascade, and pull-down holding parts of all the stages GOA circuits are the same. However, because each the pull-down holding part includes more TFT elements, which would increase GOA layout space as well as circuit power consumption.

SUMMARY

In order to at least partially solve the above problems, a technical problem mainly to be solved by the invention is to provide a scan driving circuit for an oxide semiconductor thin film transistor, which can achieve the sharing of pull-down holding circuits of a plurality of stages GOA circuits and therefore can reduce the number of TFT elements to reduce GOA layout space as well as circuit power consumption.

A first technical solution proposed by the invention is to provide a scan driving circuit for an oxide semiconductor thin film transistor. The scan driving circuit for an oxide semiconductor thin film transistor includes cascade connected P numbers of GOA units. Each of the GOA units includes a pull-up control part, a pull-up part, a transfer part, a first pull-down part, a bootstrap capacitor part and a main inverter part. The scan driving circuit further includes a common auxiliary inverter, and the main inverter part in each stage connection relationship is electrically connected to the auxiliary inverter to form a pull-down holding part of a corresponding one of the GOA units. P, N are set to be positive integers, and N≤P. In an Nth stage connection relationship, the main inverter part includes: a fifty-first transistor (T51), a gate and a drain of the fifty-first transistor both being electrically connected to a constant high potential (DCH), and a source of the fifty-first transistor being electrically connected to a fourth node (S(N)); a fifty-second transistor (T52), a gate of the fifty-second transistor being electrically connected to a first node (Q(N)), a drain of the fifty-second transistor being electrically connected to the fourth node (S(N)), and a source of the fifty-second transistor being electrically connected to a first negative potential (VSS1); a fifty-third transistor (T53), a gate of the fifty-third transistor being electrically connected to the fourth node (S(N)), a drain of the fifty-third transistor being electrically connected to the constant high potential (DCH), and a source of the fifty-third transistor being electrically connected to a second node (P(N)); a fifty-fourth transistor (T54), a gate of the fifty-fourth transistor being electrically connected to the first node (Q(N)), a drain of the fifty-fourth transistor being electrically connected to the second node (P(N)), and a source of the fifty-fourth transistor being electrically connected to a third node (K); the auxiliary inverter includes: a seventy-third transistor (T73), a gate of the seventy-third transistor being electrically connected to the fourth node (S(1)) of the main inverter part in a first stage connection relationship, and a drain of the seventy-third transistor being electrically connected to the constant high potential (DCH); a seventy-fourth transistor (T74), a gate of the seventy-fourth transistor being electrically connected to the fourth node (S(P)) of the main inverter part in a last stage connection relationship, a drain of the seventy-fourth transistor being electrically connected to the third node (K), and a source of the seventy-fourth transistor being electrically connected to a source of the seventy-third transistor (T73); a seventy-fifth transistor (T75), a gate of the seventy-fifth transistor being electrically connected to the first node (Q(1)) of the main inverter part in the first stage connection relationship, a drain of the seventy-fifth transistor being electrically connected to the third node (K), and a source of the seventy-fifth transistor being electrically connected to a constant low potential (DCL); a seventy-sixth transistor (T76), a gate of the seventy-sixth transistor being electrically connected to the first node (Q(P)) of the main inverter part in the last stage connection relationship, a drain of the seventy-sixth transistor being electrically connected to the constant low potential (DCL), and a source of the seventy-sixth transistor being electrically connected to the third node (K); the pull-up part includes: a twenty-first transistor (T21), a gate of the twenty-first transistor being electrically connected to the first node (Q(N)), a drain of the twenty-first transistor being electrically connected to a clock signal (CK(n)), and a source of the twenty-first transistor being electrically connected to an output terminal (G(N)); the transfer part includes: a twenty-second transistor (T22), a gate of the twenty-second transistor being electrically connected to the first node (Q(N)), a drain of the twenty-second transistor being electrically connected to a clock signal (CK(M)), and a source of the twenty-second transistor being electrically connected to a drive output terminal (ST(N)). A first waveform of a signal output of the first node (Q(1)) in the first stage connection relationship of the scan driving circuit is "⊓" shaped, a second waveform of the signal output of the first node (Q(P)) in the last stage connection relationship of the scan driving circuit is "⊓" shaped, and the auxiliary inverter is controlled according to a signal corresponding to an overlapped portion of the first waveform with the second waveform.

A second technical solution proposed by the invention is to provide a scan driving circuit for an oxide semiconductor thin film transistor. The scan driving circuit comprising cascade connected P numbers of GOA units, each of the GOA units includes a pull-up control part, a pull-up part, a transfer part, a first pull-down part, a bootstrap capacitor part and a main inverter part. The scan driving circuit further includes an auxiliary inverter, and the auxiliary inverter is electrically connected with the main inverter part of each stage connection relationship to form pull-up holding parts for respective GOA units. P, N are set to be positive integers, and N≤P. In an Nth stage connection relationship, the main inverter part includes: a fifty-first transistor (T51), a gate and a drain of the fifty-first transistor being electrically connected to a constant high potential (DCH), and a source of the fifty-first transistor being electrically connected to a fourth node (S(N)); a fifty-second transistor (T52), a gate of the fifty-second transistor being electrically connected to a first node (Q(N)), a drain of the fifty-second transistor being electrically connected to the fourth node (S(N)), and a source of the fifty-second transistor being electrically connected to a first negative potential (VSS1); a fifty-third transistor (T53), a gate of the fifty-third transistor being electrically connected to the fourth node (S(N)), a drain of the fifty-third transistor being electrically connected to the constant high potential (DCH), and a source of the fifty-third transistor being electrically connected to a second node (P(N)); a fifty-fourth transistor (T54), a gate of the fifty-fourth transistor being electrically connected to the first node (Q(N)), a drain of the fifty-fourth transistor being electrically connected to the second node (P(N)), and a source of the fifty-fourth transistor being electrically connected to a third node (K); the auxiliary inverter includes: a seventy-third transistor (T73), a gate of the seventy-third transistor being electrically connected to the fourth node (S(1)) of the main inverter part in a first stage connection relationship, and a drain of the seventy-third transistor being electrically connected to the constant high potential (DCH); a seventy-fourth transistor (T74), a gate of the seventy-fourth transistor being electrically connected to the fourth node (S(P)) of the main inverter part in a last stage connection relationship, a drain of the seventy-fourth transistor being electrically connected to the third node (K), and a source of the seventy-fourth transistor being electrically connected to a source of the seventy-third transistor; a seventy-fifth transistor (T75), a gate of the seventy-fifth transistor being electrically connected to the first node (Q(1)) of the main inverter part in the first stage connection relationship, a drain of the seventy-fifth transistor being electrically connected to the third node (K), and a source of the seventy-fifth transistor being electrically connected to a constant low potential (DCL); a seventy-sixth transistor (T76), a gate of the seventy-sixth transistor being electrically connected to the first node (Q(P)) of the main inverter part in the last stage connection relationship, a drain of the seventy-sixth transistor being electrically connected to the constant low potential (DCL), and a source of the seventy-sixth transistor being electrically connected to the third node (K).

In an embodiment, in the Nth stage connection relationship, the pull-up part includes a twenty-first transistor (T21), a gate of the twenty-first transistor being electrically connected to the first node (Q(N)), a drain of the twenty-first transistor being electrically connected to a clock signal (CK(n)), and a source of the twenty-first transistor being electrically connected to an output terminal (G(N)); the transfer part includes a twenty-second transistor (T22), a gate of the twenty-second transistor being electrically connected to the first node (Q(N)), a drain of the twenty-second transistor being electrically connected to a clock signal (CK(M)), and a source of the twenty-second transistor being electrically connected to a drive output terminal (ST(N)); the bootstrap capacitor part includes a capacitor (Cb), a terminal of the capacitor being electrically connected to the first node (Q(N)), and another terminal of the capacitor being electrically connected to the output terminal (G(N)).

In an embodiment, when P=3, the clock signal (CK(M)) contains four clock signals including a first clock signal (CK(1)), a second clock signal (CK(2)), a third clock signal (CK(3)) and a fourth clock signal (CK(4)).

In an embodiment, when P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

In an embodiment, a waveform duty ratio of the clock signal (CK(M)) is not greater than 25/75. Moreover, when P=3, the clock signal (CK(M)) contains four clock signals including a first clock signal (CK(1)), a second clock signal (CK(2)), a third clock signal (CK(3)) and a fourth clock signal (CK(4)). When P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

In an embodiment, a waveform duty ratio of the clock signal (CK(M)) is equal to 25/75. Moreover, when P=3, the clock signal (CK(M)) contains four clock signals including a first clock signal (CK(1)), a second clock signal (CK(2)), a third clock signal (CK(3)) and a fourth clock signal (CK(4)). When P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

In an embodiment, a first waveform of a signal output of the first node (Q(1)) in the first stage connection relationship of the scan driving circuit is "⌐⌐" shaped, a second waveform of a signal output of the first node (Q(P)) in the last stage connection relationship of the scan driving circuit is "⌐⌐" shaped, and the auxiliary inverter is controlled according to a signal corresponding to an overlapped portion of the first waveform with the second waveform.

In an embodiment, a stage-shift manner adopted by the scan driving circuit is that an (N−2)th stage shifts to the Nth stage.

In an embodiment, in the first stage connection relationship of the scan driving circuit, a gate and a drain of an eleventh transistor (T11) is electrically connected to a start pulse signal terminal (STV) of the scan driving circuit.

In an embodiment, in the last stage connection relationship of the scan driving circuit, a gate of the forty-first transistor (T41) is electrically connected to a start pulse signal terminal (STV) of the scan driving circuit.

The efficacy can be achieved by the invention is that: the invention provides a scan driving circuit for an oxide semiconductor thin film transistor, pull-down holding parts of the scan driving circuit respectively have main inverters and further have a common auxiliary inverter. The auxiliary inverter can be connected with the each of the main inverters to form corresponding pull-down holding parts for respective stages GOA circuits to thereby achieve the sharing of the pull-down holding parts of the multiple stages GOA circuits, the number/amount of the TFT elements can be reduced and therefore GOA layout space and circuit power consumption are reduced.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
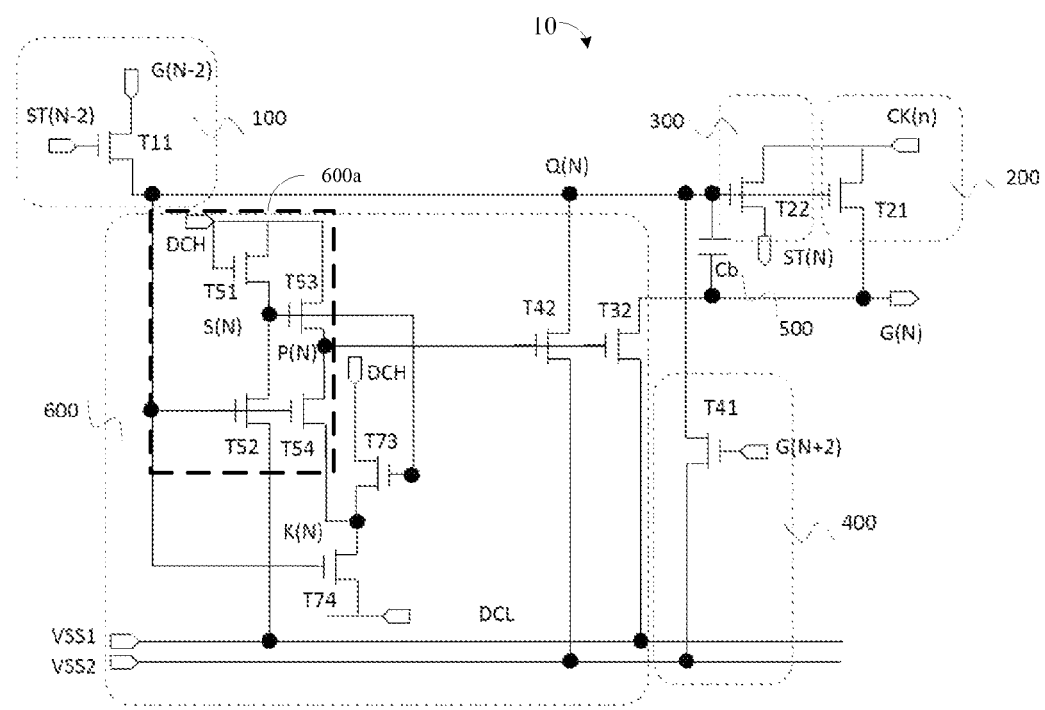
FIG. 1 is a circuit diagram of an Nth stage GOA unit of a scan driving circuit for an oxide semiconductor thin film transistor in the related art.

Referring to FIG. 1, a circuit diagram of an Nth stage GOA unit of a scan driving circuit for an oxide semiconductor thin film transistor in the related art is shown. The GOA unit 10 includes a pull-up control part 100, a pull-up part 200, a transfer part 300, a first pull-down part 400, a bootstrap capacitor part 500 and a pull-down holding part 600.

Constitution and specific connections of the above parts are as follows:

The pull-up control part 100 includes an eleventh transistor T11. A gate of the eleventh transistor T11 is electrically connected to a drive output terminal ST(N−2) of the second preceding stage GOA unit (i.e., (N−2)th stage GOA unit) of the Nth stage GOA unit, a drain of the eleventh transistor T11 is electrically connected to an output terminal G(N−2) of the (N−2)th stage GOA unit, and a source of the eleventh transistor T11 is electrically connected to a first node Q(N).

The pull-up part 200 includes a twenty-first transistor T21. A gate of the twenty-first transistor T21 is electrically connected to the first node Q(N), a drain of the twenty-first transistor T21 is electrically connected to receive a clock signal CK(n), and a source of the twenty-first transistor T21 is electrically connected to an output terminal G(N).

The transfer part 300 includes a twenty-second transistor T22. A gate of the twenty-second transistor T22 is electrically connected to the first node Q(N), a drain of the twenty-second transistor T22 is electrically connected to receive the clock signal CK(n), and a source of the twenty-second transistor T22 is electrically connected to a drive output terminal ST(N).

The first pull-down part 400 includes a forty-first transistor T41. A gate of the forth-first transistor T41 is electrically connected to an output terminal G(N+2) of the second succeeding stage GOA unit (i.e., (N+2)th stage GOA unit) of the Nth stage GOA unit, a drain of the forth-first transistor T41 is electrically connected to the first node Q(N), and a source of the forth-first transistor T41 is electrically connected to a second negative potential VSS2.

The bootstrap capacitor part 500 includes a capacitor Cb. A terminal of the capacitor Cb is electrically connected to the first node Q(N), and another terminal of the capacitor Cb is electrically connected to the output terminal G(N).

The pull-down holding part 600 includes:

a fifty-first transistor T51, a gate and a drain of the fifty-first transistor T51 both being electrically connected to a constant high potential DCH, and a source of the fifty-first transistor T51 is electrically connected to a fourth node S(N);

a fifty-second transistor T52, a gate of the fifty-second transistor T52 being electrically connected to the first node Q(N), a drain of the fifty-second transistor T52 being electrically connected to the fourth node S(N), and a source of the fifty-second transistor T52 being electrically connected to a first negative potential VSS1;

a fifty-third transistor T53, a gate of the fifty-third transistor T53 being electrically connected to the fourth node S(N), a drain of the fifty-third transistor T53 being electrically connected to the constant high potential DCH, and a source of the fifty-third transistor T53 being electrically connected to a second node P(N);

a fifty-fourth transistor T54, a gate of the fifty-fourth transistor T54 being electrically connected to the first node Q(N), a drain of the fifty-fourth transistor T54 being electrically connected to the second node P(N), and a source of the fifty-fourth transistor being electrically connected to a third node K(N);

a seventy-third transistor T73, a gate of the seventy-third transistor T73 being electrically connected to the fourth node S(N), a drain of the seventy-third transistor T73 being electrically connected to the constant high potential DCH, and a source of the seventy-third transistor T73 being electrically connected to the third node K(N);

a seventy-fourth transistor T74, a gate of the seventy-fourth transistor T74 being electrically connected to the first node Q(N), a drain of the seventy-fourth transistor T74 being electrically connected to the third node K(N), and a source of the seventy-fourth transistor T74 being electrically connected to a constant low potential DCL;

a forty-second transistor T42, a gate of the forty-second transistor T42 being electrically connected to the second node P(N), a drain of the forty-second transistor T42 being electrically connected to the first node Q(N), and a source of the forty-second transistor T42 being electrically connected to the second negative potential VSS2; and a thirty-second transistor T32, a gate of the thirty-second transistor T32 being electrically connected to the second node P(N), a drain of the thirty-second transistor T32 being electrically connected to the output terminal G(N), and a source of the thirty-second transistor T32 being electrically connected to the first negative potential VSS1.

Figure 2:
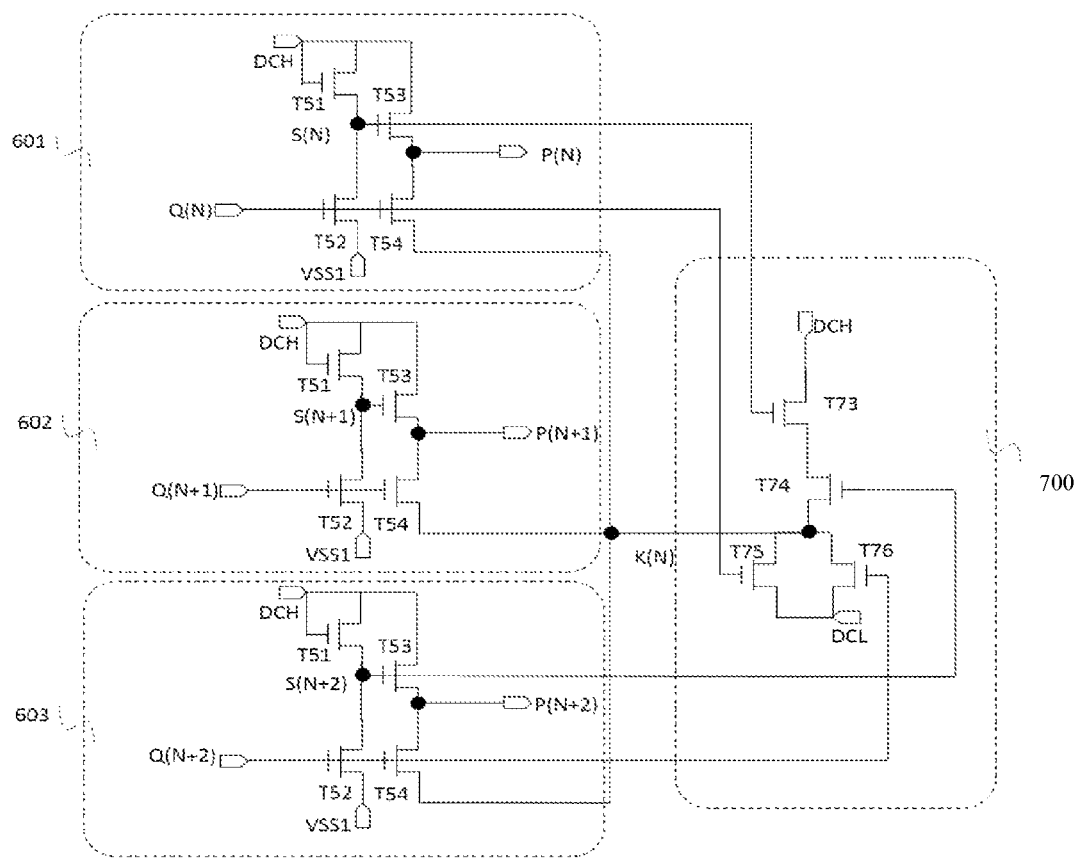
FIG. 2 is a partial circuit diagram of pull-down holding parts of a scan driving circuit for an oxide semiconductor thin film transistor in a first embodiment of the invention.

Referring to FIG. 2, a partial circuit diagram of pull-down holding parts of a scan driving circuit for an oxide semiconductor thin film transistor in a first embodiment of the invention is shown. The scan driving circuit for an oxide semiconductor thin film transistor is a scan driving circuit of an indium gallium zinc oxide (IGZO) thin film transistor and includes cascade connected P numbers of GOA units. P, N are positive integers, and N≤P. Referring to FIG. 1 and FIG. 2 together, an Nth stage GOA unit includes a pull-up control part 100, a pull-up part 200, a transfer part 300, a first pull-down part 400, a bootstrap capacitor part 500 and a pull-down holding part 600.

Constitution and specific connections of the above parts are as follows:

The pull-up control part 100 includes an eleventh transistor T11. A gate of the eleventh transistor T11 is electrically connected to a drive output terminal ST(N−2) of a second preceding stage GOA unit (i.e., (N−2)th stage GOA unit) of the Nth stage GOA unit, a drain of the eleventh transistor T11 is electrically connected to an output terminal G(N−2) of the second preceding stage GOA unit (i.e., the (N−2)th stage GOA unit) of the Nth stage GOA unit, and a source of the eleventh transistor T11 is electrically connected to a first node Q(N).

The pull-up part 200 includes a twenty-first transistor T21. A gate of the twenty-first transistor T21 is electrically connected to the first node Q(N), a drain of the twenty-first transistor T21 is electrically connected to a clock signal CK(n), and a source of the twenty-first transistor T21 is electrically connected to an output terminal G(N).

The transfer part 300 includes a twenty-second transistor T22. A gate of the twenty-second transistor T22 is electrically connected to the first node Q(N), a drain of the twenty-second transistor T22 is electrically connected to a clock signal CK(M), and a source of the twenty-second transistor T22 is electrically connected to a drive output terminal ST(N).

The first pull-down part 400 includes a forty-one transistor T41. A gate of the forty-one transistor T41 is electrically connected to a second succeeding stage GOA unit (i.e., (N+2)th stage GOA unit) of the Nth stage GOA unit, a drain of the forty-one transistor T41 is electrically connected to the first node Q(N), and a source of the forty-one transistor T41 is electrically connected to a second negative potential VSS2.

The bootstrap capacitor part 500 includes a capacitor Cb. A terminal of the capacitor Cb is electrically connected to the first node Q(N), and another terminal of the capacitor Cb is electrically connected to the output terminal G(N).

The pull-down holding part 600 includes a main inverter 600a, a thirty-second transistor T32 and a forty-second transistor T42. In particular, the main inverter 600a includes:

a fifty-first transistor (T51), a gate and a drain of the fifty-first transistor (T51) being electrically connected to a constant high potential (DCH), and a source of the fifty-first transistor (T51) being electrically connected to a fourth node (S(N));

a fifty-second transistor (T52), a gate of the fifty-second transistor (T52) being electrically connected to the first node (Q(N)), a drain of the fifty-second transistor (T52) being electrically connected to the fourth node (S(N)), and a source of the fifty-second transistor (T52) being electrically connected to a first negative potential VSS1;

a fifty-third transistor (T53), a gate of the fifty-third transistor (T53) being electrically connected to the fourth node (S(N)), a drain of the fifty-third transistor (T53) being electrically connected to the constant high potential (DCH), and a source of the fifty-third transistor (T53) being electrically connected to a second node (P(N));

a fifty-fourth transistor (T54), a gate of the fifty-fourth transistor (T54) being electrically connected to the first node (Q(N)), a drain of the fifty-fourth transistor (T54) being electrically connected to the second node (P(N)), and a source of the fifty-fourth transistor T54 being electrically connected to a third node (K).

For the forty-second transistor T42, a gate of the forty-second transistor T42 is electrically connected to the second node P(N), a drain of the forty-second transistor T42 is electrically connected to the first node Q(N), and a source of the forty-second transistor T42 is electrically connected to the second negative potential VSS2.

For the thirty-second transistor T32, a gate of the thirty-second transistor T32 is electrically connected to the second node P(N), a drain of the thirty-second transistor T32 is electrically connected to the output terminal G(N), and a source of the thirty-second transistor T32 is electrically connected to the first negative potential VSS1.

Furthermore, the GOA unit further includes an auxiliary inverter 700. The main inverter 600a in each stage connection relationship is connected with the auxiliary inverter 700 to form a pull-down holding part 600 of the corresponding GOA unit. That is, the pull-down holding parts 600 of a plurality of stages GOA circuits share the same auxiliary inverter 700.

Specifically, the auxiliary inverter 700 includes:

a seventy-third transistor (T73), a gate of the seventy-third transistor (T73) being electrically connected to the fourth node (S(1)) of the main inverter in a first stage connection relationship, and a drain of the seventy-third transistor (T73) being electrically connected to the constant high potential (DCH);

a seventy-fourth transistor (T74), a gate of the seventy-fourth transistor (T74) being electrically connected to the fourth node (S(P)) of the main inverter in a last stage connection relationship, a drain of the seventy-fourth transistor (T74) being electrically connected to the third nodes (K), and a source of the seventy-fourth transistor (T74) being electrically connected to a source of the seventy-third transistor (T73);

a seventy-fifth transistor (T75), a gate of the seventy-fifth transistor (T75) being electrically connected to the first node (Q(1)) of the main inverter in the first stage connection relationship, a drain of the seventy-fifth transistor (T75) being electrically connected to the third nodes (K), and a source of the seventy-fifth transistor (T75) being electrically connected to the constant low potential (DCL);

a seventy-sixth transistor (T76), a gate thereof being electrically connected to the first node (Q(P)) of the main inverter in the last stage connection relationship, a drain thereof being electrically connected to the constant low potential (DCL), and a source thereof being electrically connected to the third nodes (K).

Relationships among the first negative potential VSS1, the second negative potential VSS2 and the constant low potential DCL are that: the constant low potential DCL<the second negative potential VSS2<the first negative potential VSS1.

A stage-shift manner adopted by the scan driving circuit is that an (N−2)th stage shifts to an Nth stage.

In the first stage connection relationship of the scan driving circuit, the gate and the drain of eleventh transistor T11 both are electrically connected to a start pulse signal terminal STV of the circuit.

In the second stage connection relationship of the scan driving circuit, the gate and the drain of the eleventh transistor T11 both are electrically connected to the start pulse signal terminal STV of the circuit.

In the second last stage connection relationship of the scan driving circuit, the gate of the forty-first transistor T41 is electrically connected to the start pulse signal terminal STV of the circuit.

In the first last stage connection relationship of the scan driving circuit, the gate of the forty-first transistor T41 is electrically connected to the start pulse signal terminal STV of the circuit.

In the illustrated embodiment, P=3, i.e., three stages GOA units are connected. In each stage connection relationship, the main inverter 600a of the stage GOA unit and the auxiliary inverter 700 are connected to cooperatively form a corresponding pull-down holding part 600 for the stage GOA unit; and in the three stages connection relationships, the required number of transistors for forming the pull-down holding parts of the three stages is 22. However, in the scan driving circuit for an oxide semiconductor thin film transistor of the related art as shown in FIG. 1, the pull-down holding part 600 in each stage connection relationship is the same and needs 8 numbers of transistors, so that the required number of transistors for forming the pull-down holding parts of three stages is 24. Accordingly, by the embodiment of the invention, when forming three stages connection relationships, 2 numbers of transistors correspondingly are reduced.

Moreover, in this embodiment, the first pull-down part 400 only has the forty-first transistor T41 to be responsible for pulling down the first node Q(N), and the gate of the forty-first transistor T41 is electrically connected to the output terminal G(N+2) of the (N+2)th stage GOA unit, the source of T41 is electrically connected to the second negative potential VSS2. The clock signal CK(n) contains four clock signals: a first clock signal CK(1), a second clock signal CK(2), a third clock signal CK(3) and a fourth clock signal CK(4), a duty ratio of the clock signal CK(M) is set to be not greater than 25/75 as desired so as to ensure the waveform at the first node Q(N) is "⊓⊓" shaped. Preferably, the waveform duty ratio of the clock signal CK(M) are 25/75.

An operation principle of the scan driving circuit is as follows:

in the pull-down holding part 600, the fifty-first transistor T51, the fifty-second transistor T52, the fifty-third transistor T53 and the fifty-fourth transistor T54 constitute the main inverter 600a; a function of the main inverter is to control the two transistors, i.e., thirty-second transistor T32 and forty-second transistor T42. A function of the auxiliary inverter 700 is for supplying the main inverter 600a with a low potential in an effect period, and supplying the main inverter 600a with an appropriate high potential in a non-effect period to reduce electricity leakage of the fifty-fourth transistor T54, so as to ensure the main inverter 600a can generate a relatively high potential in the non-effect period.

In particular, in the effect period of the auxiliary inverter 700, after the auxiliary inverter 700 are driven by the high/low voltages i.e., the constant high potential DCH and the constant low potential DCL, the fifty-second transistor T52 is pulled down to the first negative potential VSS1, the fifty-fourth transistor T54 and the seventy-fifth transistor T75 are switched on when the first node Q(N) is at a high potential and pull down the constant high potential DCH, so that the third node K(N) is at a lower potential and the second node P(N) also is pulled down to a lower potential. That is, the auxiliary inverter 700 supplies the main inverter 600a with a low potential in the effect period, which can prevent the occurrence of electricity leakage of the thirty-second transistor T32 and the forty-second transistor T42 caused by the physical characteristic of their threshold voltages being low or close to 0V, and thus can ensure the pull-down holding part 600 in the effect period can normally pull down.

In the non-effect period of the auxiliary inverter 700, the fifty-second transistor T52, the fifty-fourth transistor T54, the seventy-fifth transistor T75 and the seventy-sixth transistor T76 all are switched off. Because the gate of the fifty-fourth transistor T54 is electrically connected to the first node Q(N), the source of T54 is electrically connected to the third node K(N), the gate of the fifty-fourth transistor T54 is at a negative potential and the source thereof is at a positive potential, Vgs thereof is a relatively very negative potential, the fifty-fourth transistor T54 can be well switched off to reduce its electricity leakage, that is, the auxiliary inverter in the non-effect period supplies an approximate high potential to the main inverter to reduce the electricity leakage of the fifty-fourth transistor T54, which can ensure the pull-down holding pat 600 to be at a relatively high potential in the non-effect period and thereby effectively to hold the first node Q(N) and the output terminal G(N) at low potentials. In addition, when the third node K(N) is at a high potential, a resistor divider function is existed, the potential at the second node P(N) can be boosted to be higher, and therefore can stabilize the potential at the second node P(N).

Figure 3:
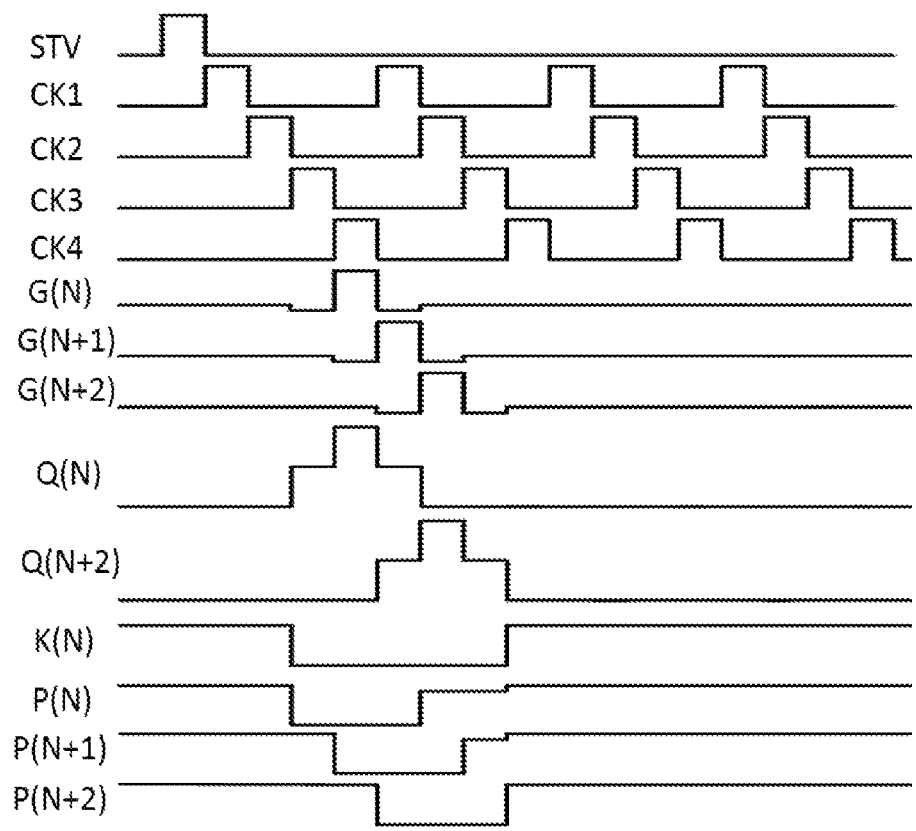
FIG. 3 is a schematic view of waveform settings and output waveforms of key nodes of the scan driving circuit for an oxide semiconductor thin film transistor with the pull-down holding part as shown in FIG. 2.

Please also refer to FIG. 3, a schematic view of waveform settings and output waveforms of key nodes of the scan driving circuit for an oxide semiconductor thin film transistor in the first embodiment of the invention is shown. STV is a start pulse signal of the circuit, CK(1)-CK(4) are clock signals of the circuit. As seen from FIG. 3, the duty ratios of the illustrated clock signal waveforms herein each are 25/75, the signal output waveform of the first node Q(N) can be ensured to be "⊓⊓" shaped. The others are output signal waveforms generated by key nodes of the circuit. It can be found from the figure, a first waveform of a signal output of the first node (Q(N)) in the first stage connection relationship of the scan driving circuit is "⊓⊓" shaped, a second waveform of a signal output of the first node (Q(N+2)) in the last stage connection relationship is "⊓⊓" shaped, and corresponding output terminal G(N) of an overlapped portion of the first waveform with the second waveform normally outputs. In the non-effect period, the first waveform of the signal output of the first node (Q(N)) in the first stage connection relationship is at a low potential, the second waveform of the signal output of the first node (Q(N+2)) in the last stage connection relationship also is at a low potential, and at this time, the output terminal G(N) is at a low potential.

Figure 4:
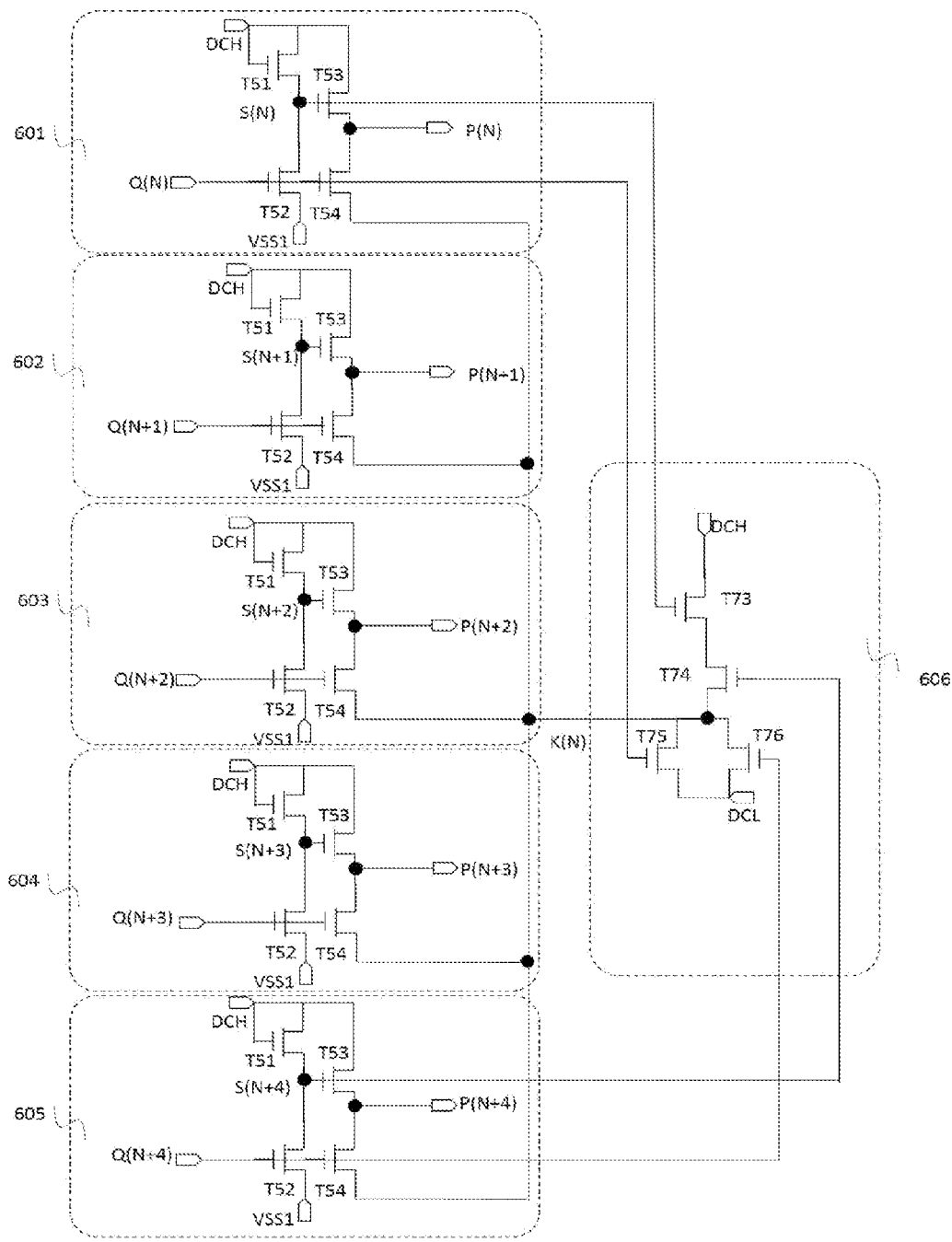
FIG. 4 is a partial circuit diagram of pull-down holding parts of a scan driving circuit for an oxide semiconductor thin film transistor in a second embodiment of the invention.

Referring to FIG. 4, a partial circuit diagram of pull-down holding parts of a scan driving circuit of an oxide semiconductor thin film transistor in a second embodiment of the invention is shown. In this embodiment, P=5, i.e., five stages GOA units are connected. In each stage connection relationship, the main inverter 600a of the stage and the auxiliary inverter 700 are connected to cooperatively form a corresponding pull-down holding part 600 for the stage; and in the five stages connection relationships, the required number of transistors for forming the pull-down holding parts of the five stages is 34. However, in the scan driving circuit for an oxide semiconductor thin film transistor of the related art as shown in FIG. 1, the pull-down holding part 600 in each stage connection relationship is the same and requires 8 numbers of transistors, so that the required number of transistors for forming the pull-down holding parts of five stages is 40. Accordingly, by this embodiment of the invention, when forming five stages connection relationships, 6 numbers of transistors correspondingly are reduced/saved.

Moreover, the clock signal CK(M) contains eight clock signals: a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)). Likewise, a duty ratio of the clock signal CK(M) is set to be not greater than 25/75 to ensure the waveform at the first node Q(N) is "⊓" shaped; and preferably, the waveform duty ratio of the clock signal CK(M) is 25/75. Besides these, in FIG. 4, the same reference numerals as those in FIG. 2 denote the same constitution, connection relationships, functions and operation principles, and thus will not be repeated herein.

Figure 5:
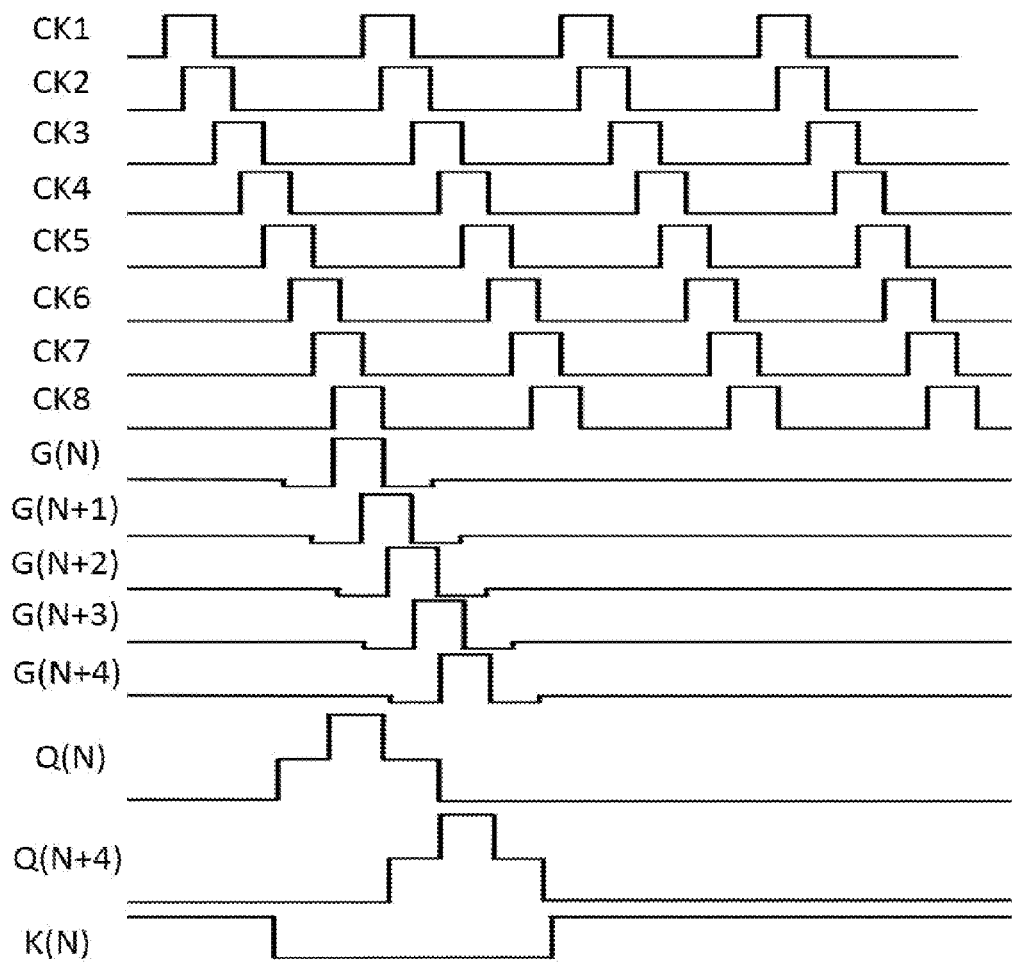
FIG. 5 is a schematic view of waveform settings and output waveforms of key nodes of the scan driving circuit for an oxide semiconductor thin film transistor with the pull-down holding part as shown in FIG. 4.

Please also refer to FIG. 5, a schematic view of waveform settings and output waveforms of key nodes of the scan driving circuit for an oxide semiconductor thin film transistor in the second embodiment of the invention is shown. STV is a start pulse signal of the circuit, CK(1)-CK(8) are clock signals of the circuit, and as seen from FIG. 5, the duty ratios of the illustrated clock signal waveforms each are 25/75 and thus can ensure the output waveform of the signal at the first node Q(N) to be "⊓⊓" shaped. The others are waveforms of output signals generated by the key nodes of the circuit. It can be found from the figure that: the first waveform of a signal output of the first node (Q(N)) in the first stage connection relationship of the scan driving circuit is "⊓" shaped, the second waveform of a signal output of the first node (Q(N+4)) in the last stage connection relationship is "⊓" shaped, corresponding output terminal G(N) of an overlapped portion of the first waveform with the second waveform normally outputs. In a non-effect period, the first waveform of the signal output of the first node (Q(N)) in the first stage connection relationship is at a low potential, the second waveform of the signal output of the first node (Q(N+4)) in the last stage connection relationship also is at a low potential, and at this time, the output terminal G(N) is at a low potential.

Sum up, the invention provides a scan driving circuit for an oxide semiconductor thin film transistor, the pull-up holding parts of the scan driving circuit for an oxide semiconductor thin film transistor respectively have main inverters and further have a common/shared auxiliary inverter, the auxiliary inverter can form a corresponding pull-down holding part with each main inverter, i.e., can achieve sharing of the pull-down holding parts of a plurality of stages GOA circuits, the number/amount of the TFT elements can be reduced and therefore GOA layout space as well as circuit power consumption can be reduced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A scan driving circuit for an oxide semiconductor thin film transistor, the scan driving circuit comprising cascade connected P numbers of GOA units, each of the GOA units comprising a pull-up control part, a pull-up part, a transfer part, a first pull-down part, a bootstrap capacitor part and a main inverter part; wherein the scan driving circuit further comprises a common auxiliary inverter, the main inverter part in each stage connection relationship is electrically connected to the auxiliary inverter to form a pull-down holding part of a corresponding one of the GOA units; P, N are set to be positive integers, and N≤P; in an Nth stage connection relationship, the main inverter part comprises:
a fifty-first transistor (T51), a gate and a drain of the fifty-first transistor both being electrically connected to a constant high potential (DCH), and a source of the fifty-first transistor being electrically connected to a fourth node (S(N));
a fifty-second transistor (T52), a gate of the fifty-second transistor being electrically connected to a first node (Q(N)), a drain of the fifty-second transistor being electrically connected to the fourth node (S(N)), and a source of the fifty-second transistor being electrically connected to a first negative potential (VSS1);
a fifty-third transistor (T53), a gate of the fifty-third transistor being electrically connected to the fourth node (S(N)), a drain of the fifty-third transistor being electrically connected to the constant high potential (DCH), and a source of the fifty-third transistor being electrically connected to a second node (P(N));
a fifty-fourth transistor (T54), a gate of the fifty-fourth transistor being electrically connected to the first node (Q(N)), a drain of the fifty-fourth transistor being electrically connected to the second node (P(N)), and a source of the fifty-fourth transistor being electrically connected to a third node (K);
the auxiliary inverter comprises:
a seventy-third transistor (T73), a gate of the seventy-third transistor being electrically connected to the fourth node (S(1)) of the main inverter part in a first stage connection relationship, and a drain of the seventy-third transistor being electrically connected to the constant high potential (DCH);
a seventy-fourth transistor (T74), a gate of the seventy-fourth transistor being electrically connected to the fourth node (S(P)) of the main inverter part in a last stage connection relationship, a drain of the seventy-fourth transistor being electrically connected to the third node (K), and a source of the seventy-fourth transistor being electrically connected to a source of the seventy-third transistor (T73);
a seventy-fifth transistor (T75), a gate of the seventy-fifth transistor being electrically connected to the first node (Q(1)) of the main inverter part in the first stage connection relationship, a drain of the seventy-fifth transistor being electrically connected to the third node (K), and a source of the seventy-fifth transistor being electrically connected to a constant low potential (DCL);

a seventy-sixth transistor (T76), a gate of the seventy-sixth transistor being electrically connected to the first node (Q(P)) of the main inverter part in the last stage connection relationship, a drain of the seventy-sixth transistor being electrically connected to the constant low potential (DCL), and a source of the seventy-sixth transistor being electrically connected to the third node (K);

the pull-up part comprises:
a twenty-first transistor (T21), a gate of the twenty-first transistor being electrically connected to the first node (Q(N)), a drain of the twenty-first transistor being electrically connected to a clock signal (CK(n)), and a source of the twenty-first transistor being electrically connected to an output terminal (G(N));

the transfer part comprises:
a twenty-second transistor (T22), a gate of the twenty-second transistor being electrically connected to the first node (Q(N)), a drain of the twenty-second transistor being electrically connected to a clock signal (CK(M)), and a source of the twenty-second transistor being electrically connected to a drive output terminal (ST(N));

wherein a first waveform of a signal output of the first node (Q(1)) in the first stage connection relationship of the scan driving circuit is "⊓" shaped, a second waveform of the signal output of the first node (Q(P)) in the last stage connection relationship of the scan driving circuit is "⊓" shaped, and the auxiliary inverter is controlled according to a signal corresponding to an overlapped portion of the first waveform with the second waveform.

2. A scan driving circuit for an oxide semiconductor thin film transistor, the scan driving circuit comprising cascade connected P numbers of GOA units, each of the GOA units comprising a pull-up control part, a pull-up part, a transfer part, a first pull-down part, a bootstrap capacitor part and a main inverter part; wherein the scan driving circuit further comprises an auxiliary inverter, the auxiliary inverter is electrically connected with the main inverter part of each stage connection relationship to form pull-up holding parts for respective GOA units; P, N are set to be positive integers, and N≤P; in an Nth stage connection relationship, the main inverter part comprises:
a fifty-first transistor (T51), a gate and a drain of the fifty-first transistor being electrically connected to a constant high potential (DCH), and a source of the fifty-first transistor being electrically connected to a fourth node (S(N));
a fifty-second transistor (T52), a gate of the fifty-second transistor being electrically connected to a first node (Q(N)), a drain of the fifty-second transistor being electrically connected to the fourth node (S(N)), and a source of the fifty-second transistor being electrically connected to a first negative potential (VSS1);
a fifty-third transistor (T53), a gate of the fifty-third transistor being electrically connected to the fourth node (S(N)), a drain of the fifty-third transistor being electrically connected to the constant high potential (DCH), and a source of the fifty-third transistor being electrically connected to a second node (P(N));
a fifty-fourth transistor (T54), a gate of the fifty-fourth transistor being electrically connected to the first node (Q(N)), a drain of the fifty-fourth transistor being electrically connected to the second node (P(N)), and a source of the fifty-fourth transistor being electrically connected to a third node (K);

the auxiliary inverter comprises:
a seventy-third transistor (T73), a gate of the seventy-third transistor being electrically connected to the fourth node (S(1)) of the main inverter part in a first stage connection relationship, and a drain of the seventy-third transistor being electrically connected to the constant high potential (DCH);
a seventy-fourth transistor (T74), a gate of the seventy-fourth transistor being electrically connected to the fourth node (S(P)) of the main inverter part in a last stage connection relationship, a drain of the seventy-fourth transistor being electrically connected to the third node (K), and a source of the seventy-fourth transistor being electrically connected to a source of the seventy-third transistor;
a seventy-fifth transistor (T75), a gate of the seventy-fifth transistor being electrically connected to the first node (Q(1)) of the main inverter part in the first stage connection relationship, a drain of the seventy-fifth transistor being electrically connected to the third node (K), and a source of the seventy-fifth transistor being electrically connected to a constant low potential (DCL);
a seventy-sixth transistor (T76), a gate of the seventy-sixth transistor being electrically connected to the first node (Q(P)) of the main inverter part in the last stage connection relationship, a drain of the seventy-sixth transistor being electrically connected to the constant low potential (DCL), and a source of the seventy-sixth transistor being electrically connected to the third node (K).

3. The scan driving circuit for an oxide semiconductor thin film transistor as claimed in claim 2, wherein in the Nth stage connection relationship,
the pull-up part comprise a twenty-first transistor (T21), a gate of the twenty-first transistor being electrically connected to the first node (Q(N)), a drain of the twenty-first transistor being electrically connected to a clock signal (CK(n)), and a source of the twenty-first transistor being electrically connected to an output terminal (G(N));
the transfer part comprises a twenty-second transistor (T22), a gate of the twenty-second transistor being electrically connected to the first node (Q(N)), a drain of the twenty-second transistor being electrically connected to a clock signal (CK(M)), and a source of the twenty-second transistor being electrically connected to a drive output terminal (ST(N));
the bootstrap capacitor part comprises a capacitor (Cb), a terminal of the capacitor being electrically connected to the first node (Q(N)), and another terminal of the capacitor being electrically connected to the output terminal (G(N)).

4. The scan driving circuit for an oxide semiconductor thin film transistor as claimed in claim 3, wherein when P=3, the clock signal (CK(M)) contains four clock signals including a first clock signal (CK(1)), a second clock signal (CK(2)), a third clock signal (CK(3)) and a fourth clock signal (CK(4)).

5. The scan driving circuit for an oxide semiconductor thin film transistor as claimed in claim 3, wherein when P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

6. The scan driving circuit for an oxide semiconductor thin film transistor as claimed in claim 3, wherein a waveform duty ratio of the clock signal (CK(M)) is not greater than 25/75.

7. The scan driving circuit for an oxide semiconductor thin film transistor as claimed in claim 6, wherein when P=3, the clock signal (CK(M)) contains four clock signals including a first clock signal (CK(1)), a second clock signal (CK(2)), a third clock signal (CK(3)) and a fourth clock signal (CK(4)).

8. The scan driving circuit for an oxide semiconductor thin film transistor as claimed in claim 6, wherein when P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

9. The scan driving circuit for an oxide semiconductor thin film transistor as claimed in claim 3, wherein a waveform duty ratio of the clock signal (CK(M)) is equal to 25/75.

10. The scan driving circuit for an oxide semiconductor thin film transistor as claimed in claim 9, wherein when P=3, the clock signal (CK(M)) contains four clock signals including a first clock signal (CK(1)), a second clock signal (CK(2)), a third clock signal (CK(3)) and a fourth clock signal (CK(4)).

11. The scan driving circuit for an oxide semiconductor thin film transistor as claimed in claim 9, wherein when P=5, the clock signal (CK(M)) contains eight clock signals including a first clock signal (CK(1)), a second clock signal (CK(2)), a third clock signal (CK(3)), a fourth clock signal (CK(4)), a fifth clock signal (CK(5)), a sixth clock signal (CK(6)), a seventh clock signal (CK(7)) and an eighth clock signal (CK(8)).

12. The scan driving circuit for an oxide semiconductor thin film transistor as claimed in claim 2, wherein a first waveform of a signal output of the first node (Q(1)) in the first stage connection relationship of the scan driving circuit is "⊓" shaped, a second waveform of a signal output of the first node (Q(P)) in the last stage connection relationship of the scan driving circuit is "⊓" shaped, and the auxiliary inverter is controlled according to a signal corresponding to an overlapped portion of the first waveform with the second waveform.

13. The scan driving circuit for an oxide semiconductor thin film transistor as claimed in claim 2, wherein a stage-shift manner adopted by the scan driving circuit is that an (N−2)th stage shifts to the Nth stage.

14. The scan driving circuit for an oxide semiconductor thin film transistor as claimed in claim 2, wherein in the first stage connection relationship of the scan driving circuit, a gate and a drain of an eleventh transistor (T11) is electrically connected to a start pulse signal terminal (STV) of the scan driving circuit.

15. The scan driving circuit for an oxide semiconductor thin film transistor as claimed in claim 2, wherein in the last stage connection relationship of the scan driving circuit, a gate of the forty-first transistor (T41) is electrically connected to a start pulse signal terminal (STV) of the scan driving circuit.

\* \* \* \* \*